(12) United States Patent
Chen et al.

(10) Patent No.: US 10,177,268 B2
(45) Date of Patent: *Jan. 8, 2019

(54) OPTICAL DEVICE, OPTICAL MODULE STRUCTURE AND MANUFACTURING PROCESS

(71) Applicant: Advanced Semiconductor Engineering, Inc., Kaohsiung (TW)

(72) Inventors: Ying-Chung Chen, Kaohsiung (TW); Hsu-Liang Hsiao, Kaohsiung (TW); Sung-Fu Yang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/870,278

(22) Filed: Jan. 12, 2018

(65) Prior Publication Data

US 2018/0182913 A1    Jun. 28, 2018

Related U.S. Application Data

(63) Continuation of application No. 15/391,648, filed on Dec. 27, 2016, now Pat. No. 9,905,722.

(51) Int. Cl.
*H01L 31/16* (2006.01)
*H01L 31/0232* (2014.01)

(52) U.S. Cl.
CPC ........ *H01L 31/16* (2013.01); *H01L 31/02325* (2013.01)

(58) Field of Classification Search
CPC .......................................... H01L 31/16–31/173
See application file for complete search history.

(56) References Cited

U.S. PATENT DOCUMENTS

| | | | |
|---|---|---|---|
| 7,021,839 B2 | 4/2006 | Ho | |
| 8,227,927 B2 | 7/2012 | Chen et al. | |
| 9,030,832 B2 | 5/2015 | Kwong et al. | |
| 9,905,722 B1* | 2/2018 | Chen | H01L 31/16 |
| 2004/0257555 A1 | 12/2004 | Takaoka et al. | |
| 2011/0157452 A1 | 6/2011 | Goh et al. | |

(Continued)

FOREIGN PATENT DOCUMENTS

| | | |
|---|---|---|
| CN | 1573286 A | 2/2005 |
| CN | 105094461 A | 11/2015 |
| TW | 201143106 A | 12/2011 |

OTHER PUBLICATIONS

Notice of Allowance for U.S. Appl. No. 15/391,648, dated Oct. 20, 2017.

(Continued)

*Primary Examiner* — Daniel P Shook
(74) *Attorney, Agent, or Firm* — Foley & Lardner LLP; Cliff Z. Liu

(57) ABSTRACT

An optical device includes: (1) an emitter; (2) a detector disposed adjacent to the emitter; (3) an encapsulation layer encapsulating the emitter and the detector; (4) a dielectric layer disposed on the emitter, the detector and the encapsulation layer; (5) a redistribution layer disposed on the dielectric layer and electrically connected to the emitter and the detector; and (6) a light shielding structure disposed on the encapsulation layer and corresponding to a location between the emitter and the detector.

21 Claims, 14 Drawing Sheets

(56) References Cited

U.S. PATENT DOCUMENTS

2011/0215250 A1   9/2011   Ohta et al.
2011/0291139 A1   12/2011  Chiu et al.

OTHER PUBLICATIONS

Office Action for corresponding Taiwan Patent Application No. 106110692 dated Jun. 5, 2018, 2 pages.
Search Report for corresponding Taiwan Patent Application No. 106110692 issued with Office Action dated Jun. 5, 2018, 2 pages.
Office Action for corresponding Chinese Patent Application No. 201710661862.2 dated Sep. 28, 2018, 5 pages.
Search Report for corresponding Chinese Patent Application No. 201710661862.2 dated Sep. 28, 2018, 4 pages.

* cited by examiner

OPTICAL DEVICE, OPTICAL MODULE STRUCTURE AND MANUFACTURING PROCESS

CROSS-REFERENCE TO RELATED APPLICATION

This application is a continuation of U.S. patent application Ser. No. 15/391,648, filed Dec. 27, 2016, the content of which is incorporated herein by reference in its entirety.

TECHNICAL FIELD

The present disclosure relates to an optical device, an optical module structure and a manufacturing process, and more particularly to an optical device including a light shielding structure for shielding light beams, an optical module structure including the same, and a manufacturing process for manufacturing the same.

BACKGROUND

An optical device may include an emitter, a detector and a clear molding compound. The clear molding compound covers the emitter and the detector. The emitter is used for emitting a light beam. The light beam is reflected by an object, and then detected by the detector. However, a portion of the light beam from the emitter may enter the detector directly, which results in cross-talk between the emitter and the detector. Such cross-talk reduces a sensitivity of the detector.

SUMMARY

In one or more embodiments, an optical device includes: (1) an emitter; (2) a detector disposed adjacent to the emitter; (3) an encapsulation layer encapsulating the emitter and the detector; (4) a dielectric layer disposed on the emitter, the detector and the encapsulation layer; (5) a redistribution layer disposed on the dielectric layer and electrically connected to the emitter and the detector; and (6) a light shielding structure disposed on the encapsulation layer and corresponding to a location between the emitter and the detector.

In one or more embodiments, an optical device includes: (1) a light source; (2) a light receiver disposed adjacent to the light source; (3) an encapsulation layer encapsulating the light source and the light receiver; (4) a redistribution layer extending from and electrically connected to the light source and the light receiver; and (5) a light shielding structure disposed on the encapsulation layer and corresponding to a location between the light source and the light receiver.

DETAILED DESCRIPTION

An optical device package can include an emitter that can emit a light beam and a detector such as a sensor die that can sense incident optical signals. The emitter can include a light-emitting area, and the sensor die can include a sensing area.

The emitter and the detector can be bonded onto and electrically connected to a substrate. A transfer mold may be positioned over the substrate, and a clear molding compound may be applied in the transfer mold to cover the emitter and the detector. However, during operation, a portion of the light beam from the light-emitting area of the emitter may directly enter the sensing area of the detector, which results in cross-talk between the emitter and the detector. Such cross-talk reduces a sensitivity of the detector.

One approach to reducing the cross-talk is to dispose a cover on the clear molding compound on the emitter and the detector. A portion of the cover may be disposed at a gap between the clear molding compound covering the emitter and the clear molding compound covering the detector, and may contact the substrate. However, the cover and the substrate of the optical device package may increase a material cost of the optical device package. Furthermore, the packaging process of the optical device package may be complicated, and thus, a manufacturing cost may be increased. That is, this approach can be expensive. In addition, a thickness of the optical device package may not be reduced efficiently due to the cover and the substrate. For example, a size of the optical device package may not be reduced to a desired value.

Device packages and techniques for manufacturing device packages discussed below reduce cross-talk between an emitter and a detector, and reduce or decrease a size and a cost of the device packages.

Figure 1:
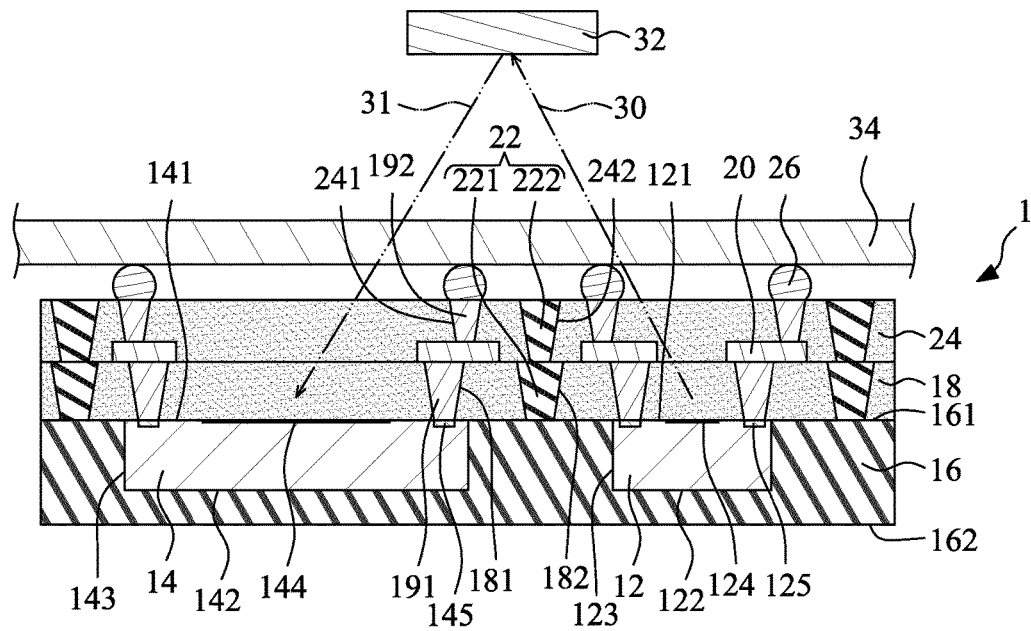
FIG. 1 depicts a cross-sectional view of an example of an optical device according to some embodiments of the present disclosure.

FIG. 1 depicts a cross-sectional view of an example of an optical device 1 according to some embodiments of the present disclosure. The optical device 1 may include an optical module structure, and may include an emitter 12, a detector 14, an encapsulation layer 16, a dielectric layer 18, a plurality of first conductive vias 191, a redistribution layer (RDL) 20, a light shielding structure 22, a covering layer 24, a plurality of second conductive vias 192 and a plurality of first external connectors 26.

The emitter 12 is a light source which receives an electrical signal and, in response, generates an optical signal, such as a light beam 30 of a particular wavelength. The emitter 12 can include devices such as light emitting diodes (LEDs) or laser diodes. The emitter 12 has a first surface 121, a second surface 122, at least one side surface 123, a light-emitting area 124 and a plurality of pads 125. The second surface 122 is opposite to the first surface 121, and the side surface 123 extends between the first surface 121 and the second surface 122. The light-emitting area 124 is disposed adjacent to the first surface 121, and is used for emitting a light beam 30. The pads 125 are disposed adjacent to the first surface 121, and are used for electrical connection.

The detector 14 is a light receiver such as a sensor die which detects optical signals (e.g., light beams), and, in response, generates corresponding electrical signals. The detector 14 includes one or more optical sensors, such as photoconductive devices, photovoltaics, photodiodes, phototransistors, or a combination thereof. The detector 14 has a first surface 141, a second surface 142, at least one side surface 143, a sensing area 144 and a plurality of pads 145. The second surface 142 is opposite to the first surface 141, and the side surface 143 extends between the first surface 141 and the second surface 142. The sensing area 144 is disposed adjacent to the first surface 141, and is used for detecting a light beam 31 reflected by an object 32. The pads 145 are disposed adjacent to the first surface 141, and are used for electrical connection.

The encapsulation layer 16 is an encapsulant such as a molding compound, and covers the second surface 122 and the side surface 123 of the emitter 12 and the second surface 142 and the side surface 143 of the detector 14. The encapsulation layer 16 has a first surface 161 and a second surface 162 opposite to the first surface 161. In some embodiments, the emitter 12 and the detector 14 are embedded in the encapsulation layer 16, and the first surface 121 of the emitter 12 and the first surface 141 of the detector 14 are exposed from the first surface 161 of the encapsulation layer 16. The emitter 12 and the detector 14 are disposed side by side. The first surface 121 of the emitter 12 is substantially coplanar with the first surface 141 of the detector 14 and the first surface 161 of the encapsulation layer 16.

The dielectric layer 18 is disposed on the first surface 121 of the emitter 12, the first surface 141 of the detector 14 and the first surface 161 of the encapsulation layer 16. The dielectric layer 18 is a transparent material such as polybenzoxazole (PBO) or polyimide (PI). That is, the dielectric layer 18 allows the light beams 30, 31 to pass through. The dielectric layer 18 defines a plurality of first openings 181 and at least one second opening 182. The first openings 181 may extend through the dielectric layer 18, and the locations of the first openings 181 correspond to the pads 145 of the detector 14 and the pads 125 of the emitter 12. The second opening 182 may extend through the dielectric layer 18, and a location of the second opening 182 corresponds to a location between the emitter 12 and the detector 14. For example, the second opening 182 is disposed between the side surface 123 of the emitter 12 and the side surface 143 of the detector 14. Alternatively, the second opening 182 may surround the emitter 12 and the detector 14.

The first conductive vias 191 are disposed in the first openings 181 to electrically connect respective ones of the pads 145 of the detector 14 and the pads 125 of the emitter 12. A material of the first conductive via 191 may be metal, such as, copper.

A first portion 221 of the light shielding structure 22 is disposed in the second opening 182 of the dielectric layer 18. The first portion 221 of the light shielding structure 22 may be a wall, and a width of the first portion 221 of the light shielding structure 22, measured along a direction extending from the first surface 161 of the encapsulation layer 16 to the RDL 20, may be greater than a width of the side surface 123 of the emitter 12 or the side surface 143 of the detector 14. A material of the first portion 221 of the light shielding structure 22 may be an opaque material or a light-absorbing material which can block the light beam 30 from the emitter 12. For example, the first portion 221 of the light shielding structure 22 may not allow the light beam 30 to pass through. In some embodiments, a material of the first portion 221 of the light shielding structure 22 may be metal (e.g., copper) or an organic material. The first portion 221 of the light shielding structure 22 may fill the second opening 182 of the dielectric layer 18. In some embodiments, the first portion 221 of the light shielding structure 22 and the first conductive vias 191 may be formed concurrently The RDL 20 is a circuit layer, and is disposed on the dielectric layer 18 and electrically connected to the pads 125 of the emitter 12 and to the pads 145 of the detector 14 through the first conductive vias 191. The RDL 20 is not disposed directly above the light-emitting area 124 of the emitter 12 and the sensing area 144 of the detector 14. In some embodiments in which a material of the first portion 221 of the light shielding structure 22 is metal, the RDL 20 may not contact the first portion 221 of the light shielding structure 22. However, in some embodiments in which the material of the first portion 221 of the light shielding structure 22 is organic material, the RDL 20 may contact or cover the first portion 221 of the light shielding structure 22.

The covering layer 24 is disposed on the dielectric layer 18 to cover the dielectric layer 18 and the RDL 20. The covering layer 24 may be made from a transparent material such as PBO or PI, which may be the same as or different from the material of the dielectric layer 18. For example, the covering layer 24 also allows the light beams 30, 31 to pass through. The covering layer 24 defines a plurality of first openings 241 and at least one second opening 242. The first openings 241 may extend through the covering layer 24 to expose a portion of the RDL 20. The second opening 242 may extend through the covering layer 24, and a location of the second opening 242 may correspond to or align with the location of the second opening 182 of the dielectric layer 18. In some embodiments, the second opening 242 of the covering layer 24 and the second opening 182 of the dielectric layer 18 may be formed concurrently.

The second conductive vias 192 are disposed in the first openings 241 of the covering layer 24 to electrically connect the RDL 20. A material of the second conductive vias 192 may be metal, such as, copper. A second portion 222 of the light shielding structure 22 is disposed in the second opening 242 of the covering layer 24. The second portion 222 may be a wall corresponding to or aligned with the first portion 221 of the light shielding structure 22. A material of the second portion 222 of the light shielding structure 22 may be an opaque material or light-absorbing material which can block the light beam 30 from the emitter 12. In some embodiments, the material of the second portion 222 of the light shielding structure 22 may be metal (e.g., copper) or an organic material which may be the same as or different from the material of the first portion 221. The second portion 222 of the light shielding structure 22 may fill the second opening 242 of the covering layer 24. In some embodiments, the first portion 221 and the second portion 222 may be formed concurrently and integrally.

The first external connectors 26, which may include solder balls or solder bumps, are disposed on respective ones of the second conductive vias 192.

In one or more embodiments, the optical device 1 is attached to a carrier 34 through the first external connectors 26. The carrier 34 may be made from a transparent material, such as, glass (e.g., indium tin oxide (ITO) glass). For example, the carrier 34 allows the light beams 30,31 to pass through. In operation, if the object 32 exists, the light beam 30 from the emitter 12 passes through the dielectric layer 18, the covering layer 24 and the carrier 34, and then is reflected by the object 32. After the reflected light beam 31 passes through the carrier 34, the covering layer 24 and the dielectric layer 18, the light beam 31 may be detected by the detector 14 and, in response, the detector 14 may generate corresponding electrical signals. Thus, if cross-talk between the emitter 12 and the detector 14 occurs, the cross-talk may reduce a sensitivity of the detector 14.

In some embodiments, because the light shielding structure 22 (including the first portion 221 and the second portion 222) is disposed at the location corresponding to or aligned with a location between the emitter 12 and the detector 14, cross-talk between the emitter 12 and the detector 14 is decreased. For example, the light shielding structure 22 can prevent the light beam 30 from the emitter 12 from entering the detector 14 directly. Therefore, the above-mentioned cover and substrate can be omitted in the optical device 1. As a result, a size and a manufacturing cost of the optical device 1 can be reduced efficiently.

Figure 2:
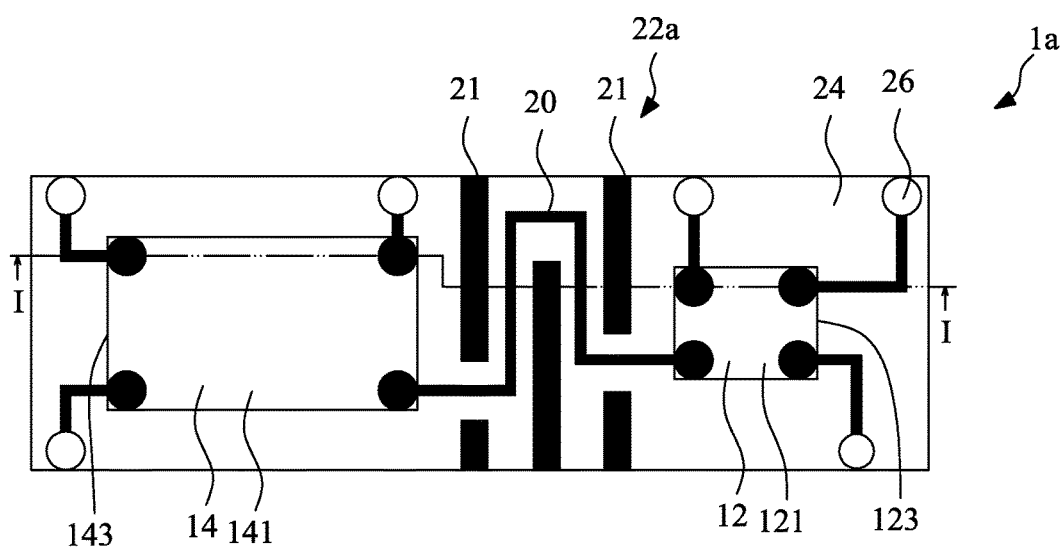
FIG. 2 depicts a top view of an example of an optical device according to some embodiments of the present disclosure.
Figure 3:
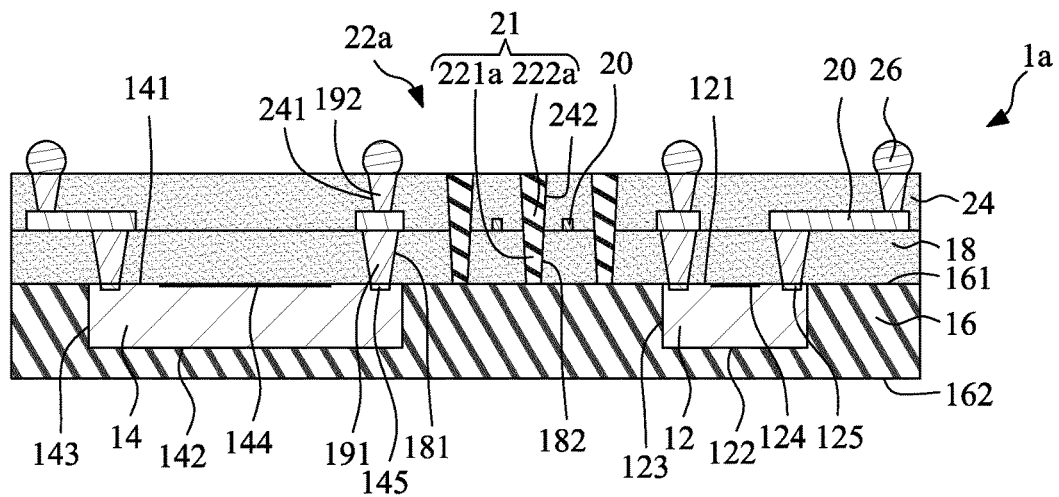
FIG. 3 depicts a cross-sectional view taken along line I-I of an example of the optical device shown in FIG. 2 according to some embodiments of the present disclosure.

FIG. 2 depicts a top view of an example of an optical device 1a according to some embodiments of the present disclosure. FIG. 3 depicts a cross-sectional view taken along a line I-I of the example of the optical device 1a according to some embodiments. The optical device 1a is similar to the optical device 1 shown in FIG. 1, and similar features are numbered alike and may not be further described with respect to FIGS. 2 and 3. In some embodiments, the dielectric layer 18 defines a plurality of second openings 182, and the covering layer 24 defines a plurality of second openings 242. The second openings 182 and the second openings 242 may be connected with each other, and formed concurrently. A light shielding structure 22a includes a plurality of wall segments 21 disposed in respective ones of the second openings 182 and the second openings 242. Each of the wall segments 21 may include a first portion 221a disposed in each of the second openings 182 and a second portion 222a disposed in each of the second openings 242. The first portion 221a and the second portion 222a may be formed concurrently and integrally. In some embodiments, a material of the wall segments 21 may be metal, and the wall segments 21 may be separated from each other and arranged in a fence structure, so as to improve a shielding effect. Thus, cross-talk between the emitter 12 and the detector 14 is reduced. Furthermore, in order to avoid a short circuit, a portion of the RDL 20 is routed between the wall segments 21. For example, the RDL 20 may not contact the wall segments 21. However, in one or more embodiments, the material of the wall segments 21 may be an organic material, and the RDL 20 may contact the wall segments 21.

Figure 4:
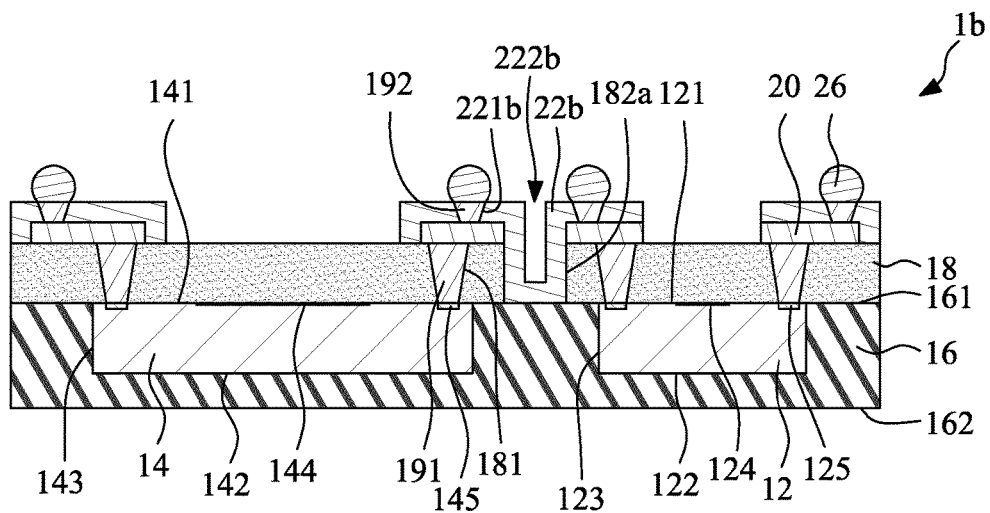
FIG. 4 depicts a cross-sectional view of an example of an optical device according to some embodiments of the present disclosure.

FIG. 4 depicts a cross-sectional view of an example of an optical device 1b according to some embodiments of the present disclosure. The optical device 1b shown in FIG. 4 is similar to the optical device 1 as shown in FIG. 1, and similar features are numbered alike and may not be further described with respect to FIG. 4. In some embodiments, the covering layer 24 shown in FIG. 1 may be omitted, and a light shielding structure 22b may be disposed in a second opening 182a of the dielectric layer 18 and may be further disposed on the dielectric layer 18 to cover the dielectric layer 18 and the RDL 20. A width of the second opening 182a of the dielectric layer 18 may be greater than a width of the second opening 182 of the dielectric layer 18 shown in FIG. 1. The light shielding structure 22b is not disposed directly above the light-emitting area 124 of the emitter 12 and the sensing area 144 of the detector 14. Furthermore, the light shielding structure 22b on the dielectric layer 18 defines a plurality of first openings 221b to expose a portion of the RDL 20. The second conductive vias 192 are disposed in the first openings 221b of the light shielding structure 22b to electrically connect the RDL 20. In addition, the light shielding structure 22b in the second opening 182a of the dielectric layer 18 defines a central opening 222b. For example, the light shielding structure 22b may not completely fill the second opening 182a of the dielectric layer 18.

Figure 5:
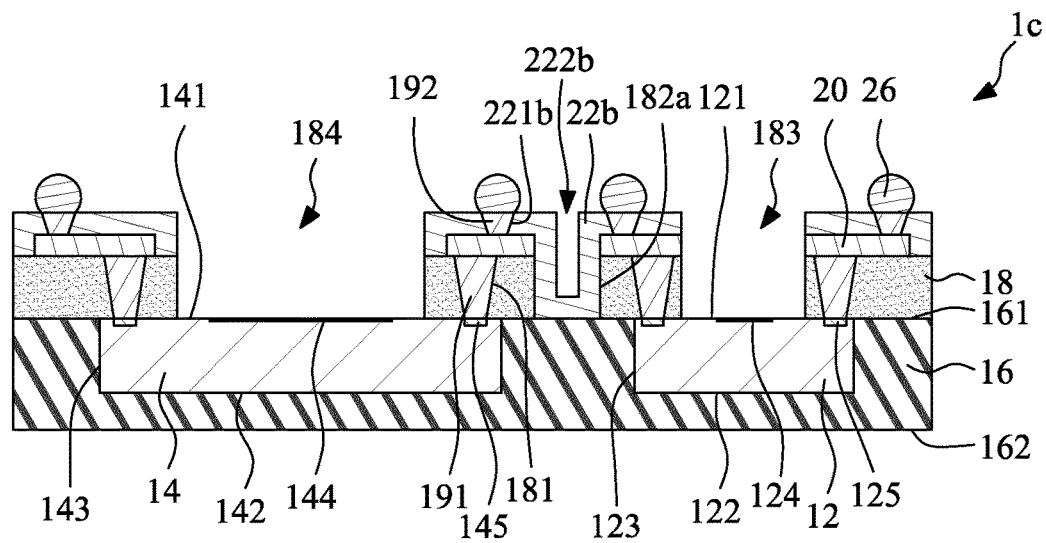
FIG. 5 depicts a cross-sectional view of an example of an optical device according to some embodiments of the present disclosure.

FIG. 5 depicts a cross-sectional view of an example of an optical device 1c according to some embodiments of the present disclosure. The optical device 1c shown in FIG. 5 is similar to the optical device 1b as shown in FIG. 4, and similar features are numbered alike and may not be further described with respect to FIG. 5. In some embodiments, the dielectric layer 18 further defines a first through hole 183 to expose the light-emitting area 124 of the emitter 12 and a second through hole 184 to expose the sensing area 144 of the detector 14. The first through hole 183 and the second through hole 184 can decrease a loss of a density of the light beams 30, 31 when the light beams 30, 31 pass through the dielectric layer 18.

Figure 6:
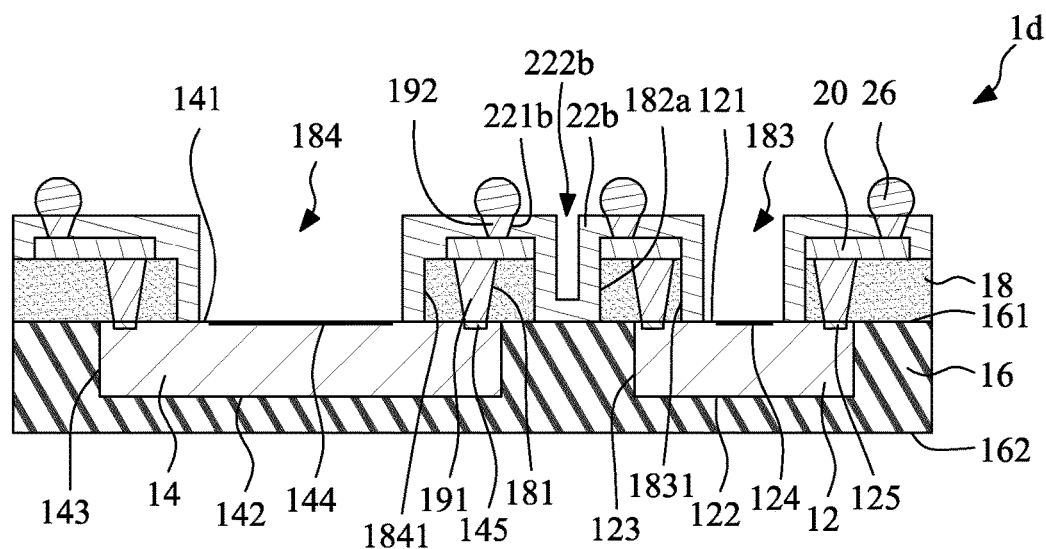
FIG. 6 depicts a cross-sectional view of an example of an optical device according to some embodiments of the present disclosure.

FIG. 6 depicts a cross-sectional view of an example of an optical device 1d according to some embodiments of the present disclosure. The optical device 1d shown in FIG. 6 is similar to the optical device 1c as shown in FIG. 5, and similar features are numbered alike and may not be further described with respect to FIG. 6. In some embodiments, a portion of the light shielding structure 22b is further disposed on a sidewall 1831 of the first through hole 183 and a sidewall 1841 of the second through hole 184, so as to increase the shielding effect.

Figure 7:
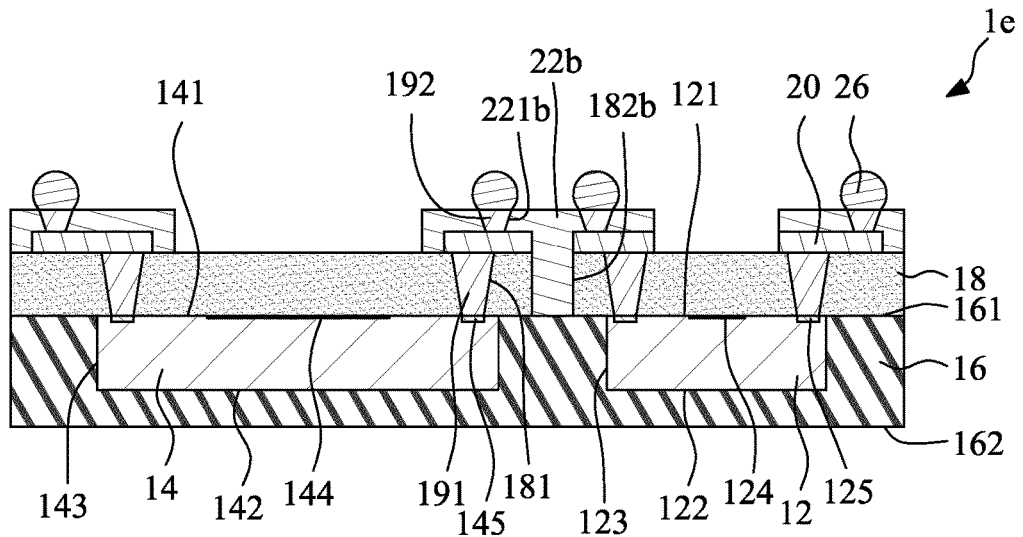
FIG. 7 depicts a cross-sectional view of an example of an optical device according to some embodiments of the present disclosure.

FIG. 7 depicts a cross-sectional view of an example of an optical device 1e according to some embodiments of the present disclosure. The optical device 1e shown in FIG. 7 is similar to the optical device 1b as shown in FIG. 4, and similar features are numbered alike and may not be further described with respect to FIG. 7. In some embodiments, the light shielding structure 22b fills the second opening 182b of the dielectric layer 18. The width of the second opening 182b of the dielectric layer 18 may be less than the width of the second opening 182a of the dielectric layer 18 shown in FIG. 4.

Figure 8:
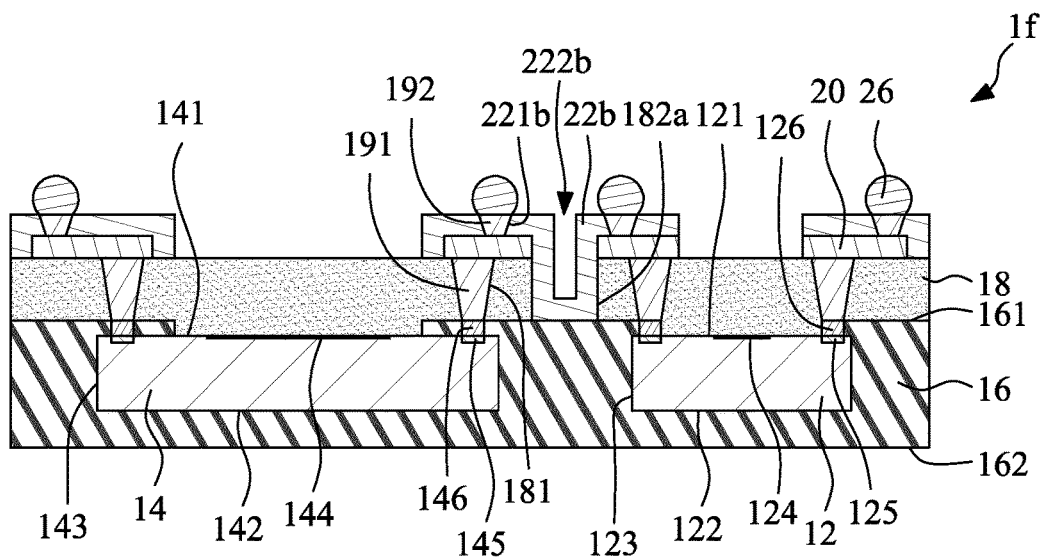
FIG. 8 depicts a cross-sectional view of an example of an optical device according to some embodiments of the present disclosure.

FIG. 8 depicts a cross-sectional view of an example of an optical device 1f according to some embodiments of the present disclosure. The optical device 1f shown in FIG. 8 is similar to the optical device 1b as shown in FIG. 4, and similar features are numbered alike and may not be further described with respect to FIG. 8. In some embodiments, the emitter 12 further includes a plurality of conductive bumps 126 protruding from the first surface 121 of the emitter 12 and electrically connecting the pads 125 of the emitter 12. Furthermore, the detector 14 further includes a plurality of conductive bumps 146 protruding from the first surface 141 of the detector 14 and electrically connecting the pads 145 of the detector 14. The first conductive vias 191 are electrically connected to respective ones of the conductive bumps 146 of the detector 14 and the conductive bumps 126 of the emitter 12. In addition, the encapsulation layer 16 may further cover a portion of the first surface 121 of the emitter 12 and a portion of the first surface 141 of the detector 14.

Figure 9:
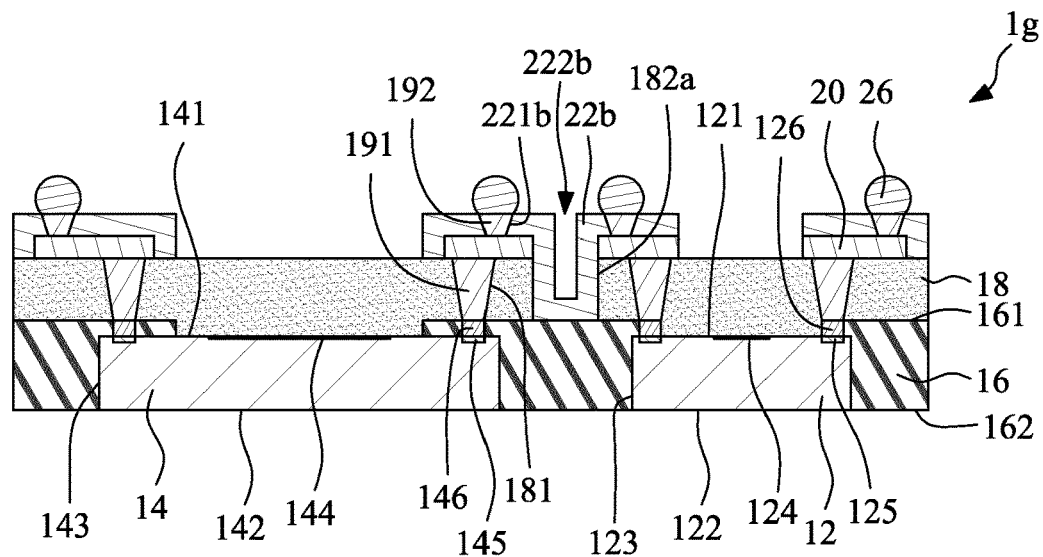
FIG. 9 depicts a cross-sectional view of an example of an optical device according to some embodiments of the present disclosure.

FIG. 9 depicts a cross-sectional view of an example of an optical device 1g according to some embodiments of the present disclosure. The optical device 1g shown in FIG. 9 is similar to the optical device 1f as shown in FIG. 8, and similar features are numbered alike and may not be further described with respect to FIG. 9. In some embodiments, the second surface 122 of the emitter 12 and the second surface 142 of the detector 14 are exposed from the second surface 162 of the encapsulation layer 16 for allowing heat dissipation. In some embodiments, the second surface 122 of the emitter 12, the second surface 142 of the detector 14 and the second surface 162 of the encapsulation layer 16 are coplanar (e.g., substantially coplanar) with each other.

Figure 10:
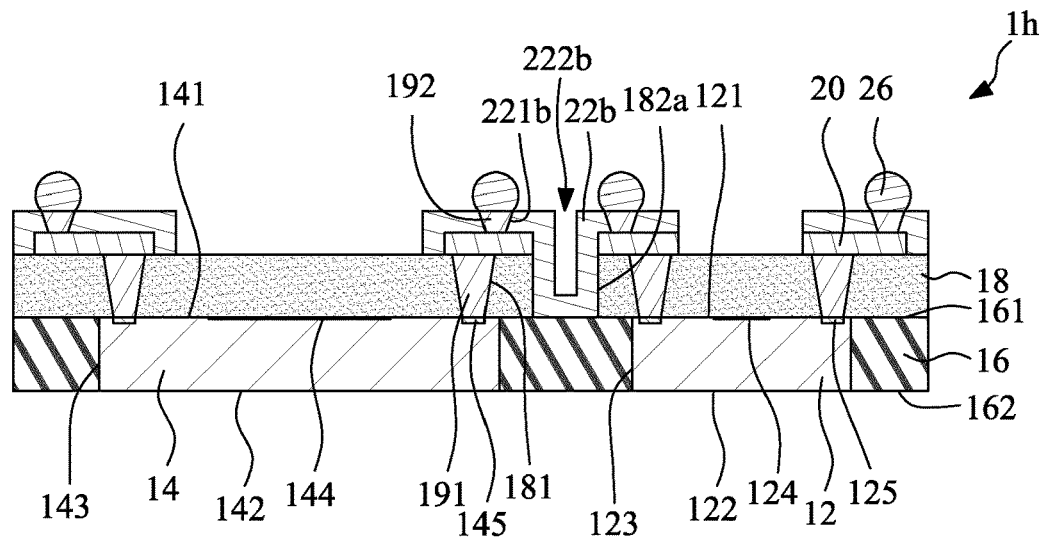
FIG. 10 depicts a cross-sectional view of an example of an optical device according to some embodiments of the present disclosure.

FIG. 10 depicts a cross-sectional view of an example of an optical device 1h according to some embodiments of the present disclosure. The optical device 1h shown in FIG. 10 is similar to the optical device 1b as shown in FIG. 4, and similar features are numbered alike and may not be further described with respect to FIG. 10. In some embodiments, the second surface 122 of the emitter 12 and the second surface 142 of the detector 14 are exposed from the second surface 162 of the encapsulation layer 16 for allowing heat dissipation. In some embodiments, the second surface 122 of the emitter 12, the second surface 142 of the detector 14 and the second surface 162 of the encapsulation layer 16 are coplanar (e.g., substantially coplanar) with each other.

Figure 11:
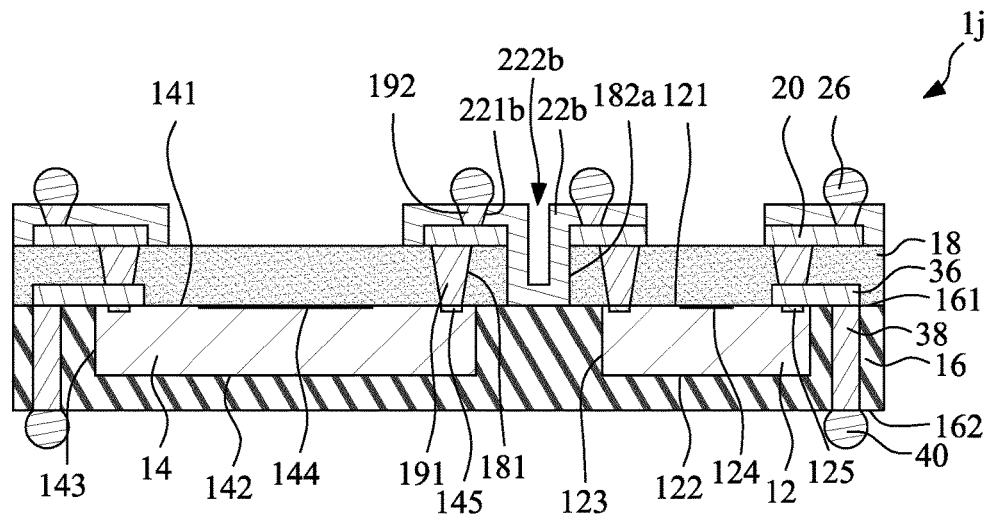
FIG. 11 depicts a cross-sectional view of an example of an optical device according to some embodiments of the present disclosure.

FIG. 11 depicts a cross-sectional view of an example of an optical device 1j according to some embodiments of the present disclosure. The optical device 1j shown in FIG. 11 is similar to the optical device 1b as shown in FIG. 4, and similar features are numbered alike and may not be further described with respect to FIG. 11. In some embodiments, the optical device 1j further includes an intermediate circuit layer 36, a plurality of third conductive vias 38 and a plurality of second external connectors 40. The intermediate circuit layer 36 (e.g., an RDL) is disposed on the first surface 161 of the encapsulation layer 16 and electrically connected to the pads 125 of the emitter 12 and the pads 145 of the detector 14. A portion of the first conductive vias 191 may be electrically connected to the intermediate circuit layer 36. The third conductive vias 38 extend through the encapsulation layer 16. The second external connectors 40 (e.g., solder balls or solder bumps) are disposed on the second surface 162 of the encapsulation layer 16 and on respective ones of the third conductive vias 38. Thus, the second external connectors 40 are electrically connected to the intermediate circuit layer 36 and the RDL 20.

Figure 12:
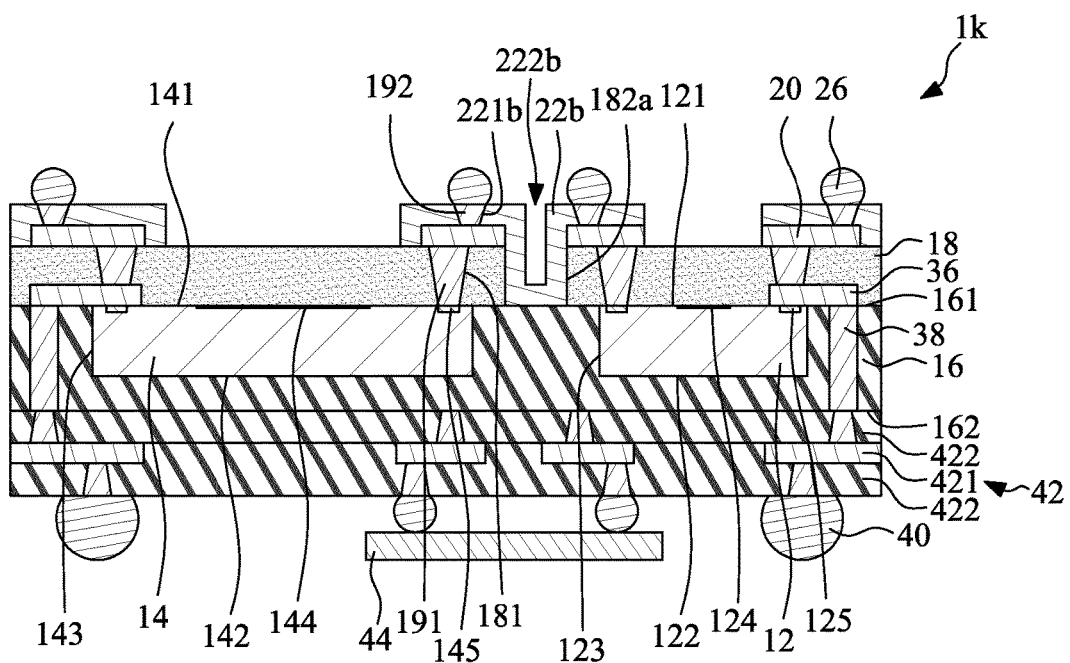
FIG. 12 depicts a cross-sectional view of an example of an optical device according to some embodiments of the present disclosure.

FIG. 12 depicts a cross-sectional view of an example of an optical device 1k according to some embodiments of the present disclosure. The optical device 1k shown in FIG. 12 is similar to the optical device 1j as shown in FIG. 11, and similar features are numbered alike and may not be further described with respect to FIG. 12. In some embodiments, the optical device 1k further includes a conductive structure 42. The conductive structure 42 is disposed on the second surface 162 of the encapsulation layer 16, and includes at least one patterned circuit layer 421 (e.g., an RDL) embedded in at least two insulation layers 422. The patterned circuit layer 421 is electrically connected to the third conductive vias 38. The second external connectors 40 are disposed on the conductive structure 42 and are electrically connected to the patterned circuit layer 421. In some embodiments, a semiconductor chip 44 may be electrically connected to the patterned circuit layer 421 of the conductive structure 42.

Figure 13:
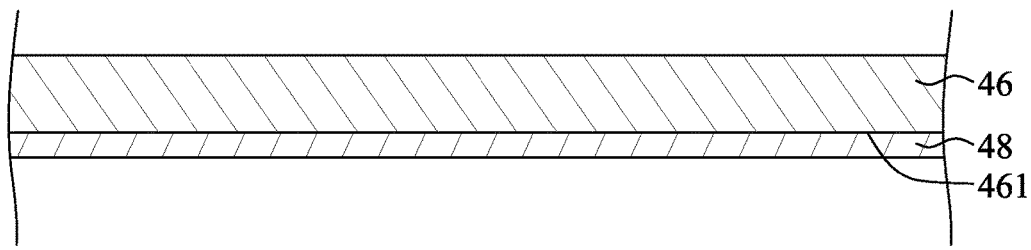
FIG. 13, FIG. 14, FIG. 15, FIG. 16, FIG. 17, FIG. 18, FIG. 19, FIG. 20 and FIG. 21 depict a manufacturing process for manufacturing an optical device according to some embodiments of the present disclosure.

FIGS. 13-21 depict a manufacturing process for manufacturing an optical device according to some embodiments of the present disclosure. Referring to FIG. 13, a carrier 46 and an adhesion layer 48 are provided. The adhesion layer 48 is adhered to a first surface 461 of the carrier 46.

Figure 14:
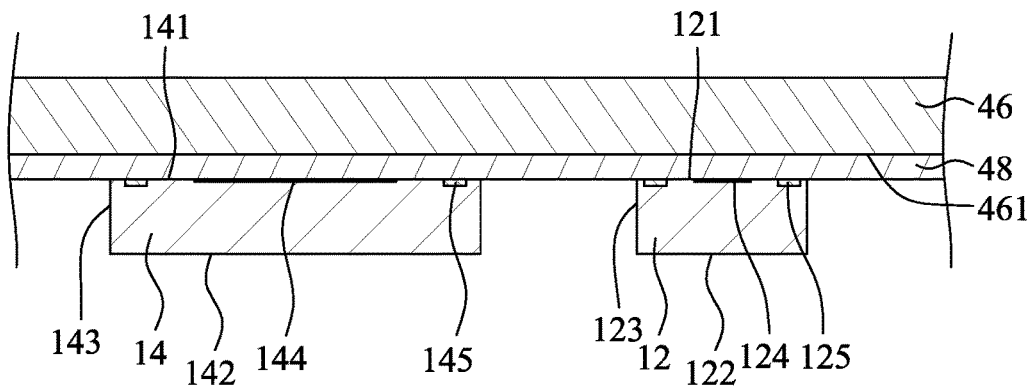

Referring to FIG. 14, at least one emitter 12 and at least one detector 14 are attached to the first surface 461 of the carrier 46 through the adhesion layer 48. The emitter 12 is a light source which receives an electrical signal and, in response, generates an optical signal, such as the light beam 30 of a particular wavelength. The emitter 12 can include devices such as LEDs or laser diodes. The emitter 12 includes the first surface 121, the second surface 122, the at least one side surface 123, the light-emitting area 124 and the plurality of pads 125. The second surface 122 is opposite to the first surface 121, and the side surface 123 extends between the first surface 121 and the second surface 122. The light-emitting area 124 is disposed adjacent to the first surface 121, and is used for emitting the light beam 30. The pads 125 are disposed adjacent to the first surface 121, and are used for electrical connection.

The detector 14 is a light receiver such as a sensor die which detects optical signals (e.g., light beams), and, in response, generates corresponding electrical signals. The detector 14 includes one or more optical sensors, such as photoconductive devices, photovoltaics, photodiodes, phototransistors, or a combination thereof. The detector 14 includes the first surface 141, the second surface 142, the at least one side surface 143, the sensing area 144 and the plurality of pads 145. The second surface 142 is opposite to the first surface 141, and the side surface 143 extends between the first surface 141 and the second surface 142. The sensing area 144 is disposed adjacent to the first surface 141, and is used for detecting the light beam 31 reflected by the object 32. The pads 145 are disposed adjacent to the first surface 141, and are used for electrical connection.

In some embodiments, the first surface 121 of the emitter 12 and the first surface 141 of the detector 14 face the first surface 461 of the carrier 46. The emitter 12 and the detector 14 are disposed side by side. The first surface 121 of the emitter 12 is substantially coplanar with the first surface 141 of the detector 14.

Figure 15:
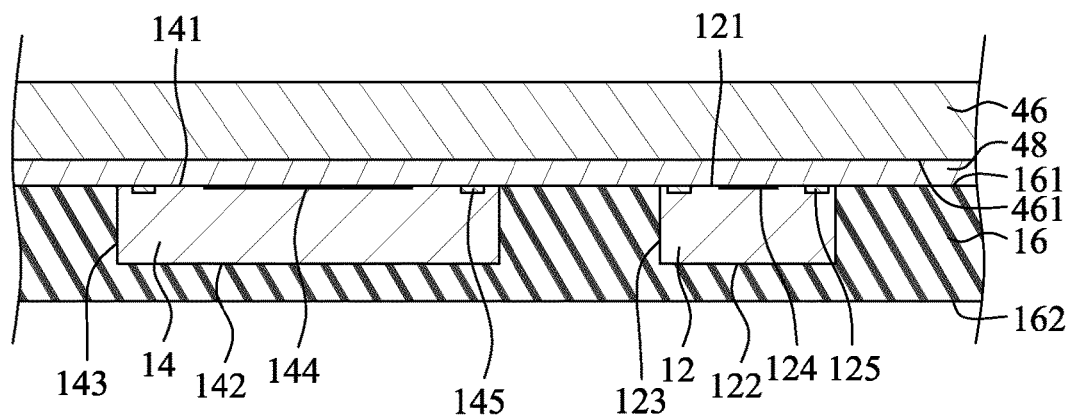

Referring to FIG. 15, an encapsulation layer 16 (e.g., a molding compound) is formed to cover the second surface 122 and the side surface 123 of the emitter 12 and the second surface 142 and the side surface 143 of the detector 14. In addition, the encapsulation layer 16 further covers a portion of the adhesion layer 48 on the first surface 461 of the carrier 46. The encapsulation layer 16 includes a first surface 161 and a second surface 162 opposite to the first surface 161.

Figure 16:
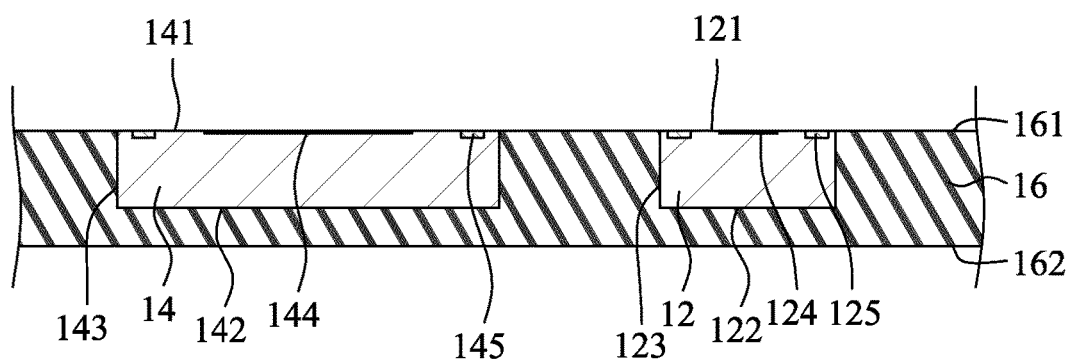

Referring to FIG. 16, the carrier 46 and the adhesion layer 48 are removed from the encapsulation layer 16. Thus, the emitter 12 and the detector 14 are embedded in the encapsulation layer 16, and the first surface 121 of the emitter 12 and the first surface 141 of the detector 14 are exposed from the first surface 161 of the encapsulation layer 16. The first surface 121 of the emitter 12, the first surface 141 of the detector 14 and the first surface 161 of the encapsulation layer 16 are substantially coplanar with each other.

Figure 17:
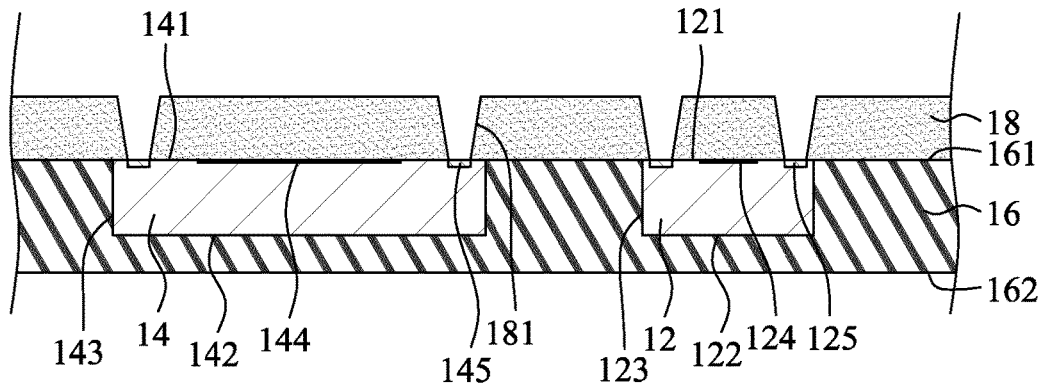

Referring to FIG. 17, a dielectric layer 18 is formed to cover at least a portion of the emitter 12 and at least a portion of the detector 14. In one or more embodiments, the dielectric layer 18 is disposed on the first surface 121 of the emitter 12, the first surface 141 of the detector 14 and the first surface 161 of the encapsulation layer 16. The dielectric layer 18 may be made from a transparent material such as PBO or PI. For example, the dielectric layer 18 may allow the light beams 30, 31 to pass through. Then, a plurality of first openings 181 are formed on the dielectric layer 18. The first openings 181 may extend through the dielectric layer 18, and the locations of the first openings 181 correspond to or align with the pads 145 of the detector 14 and the pads 125 of the emitter 12.

Figure 18:
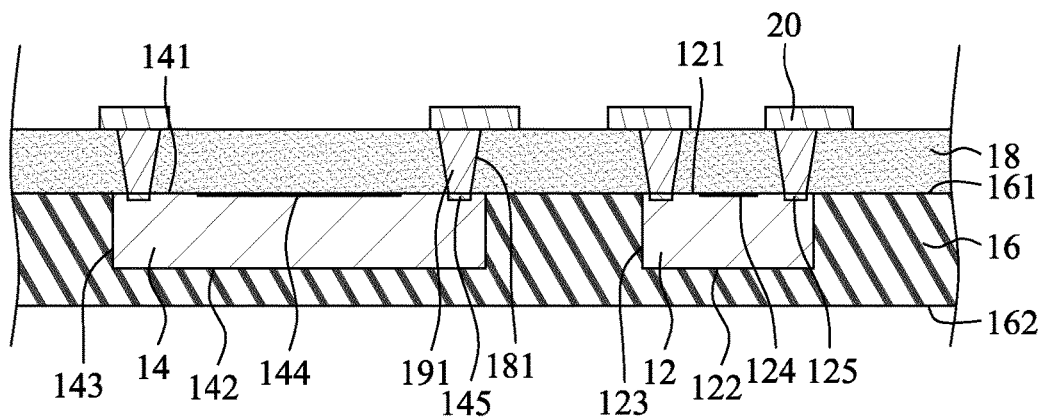

Referring to FIG. 18, the plurality of first conductive vias 191 are formed in the first openings 181 to electrically connect respective ones of the pads 145 of the detector 14 and the pads 125 of the emitter 12. The material of the first conductive vias 191 may be metal, such as, copper. Then, the RDL 20 is formed on the dielectric layer 18 and electrically connected to the pads 125 of the emitter 12 and the pads 145 of the detector 14 through the first conductive vias 191. The RDL 20 is not disposed directly above the light-emitting area 124 of the emitter 12 and the sensing area 144 of the detector 14.

Figure 19:
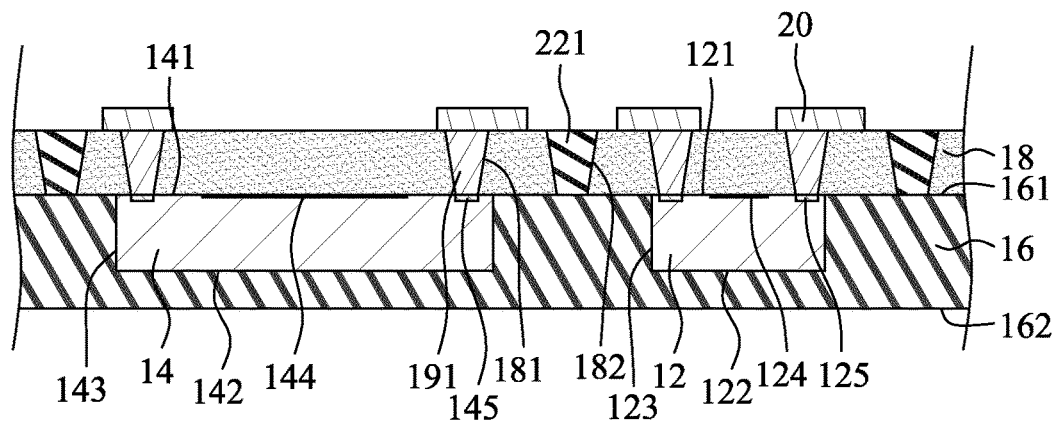

Referring to FIG. 19, at least one second opening 182 is formed on the dielectric layer 18. The second opening 182 may extend through the dielectric layer 18, and the location of the second opening 182 corresponds to or aligns with a location between the emitter 12 and the detector 14. For example, the second opening 182 is disposed between the side surface 123 of the emitter 12 and the side surface 143 of the detector 14. In some embodiments, the second opening 182 may surround the emitter 12 and the detector 14.

Then, a first portion 221 of the light shielding structure 22 is formed in the second opening 182 of the dielectric layer 18. The first portion 221 of the light shielding structure 22 may be a wall, and the width of the first portion 221 of the light shielding structure 22, measured along a direction extending from the first surface 161 of the encapsulation layer 16 to the RDL 20, may be greater than the width of the side surface 123 of the emitter 12 or the side surface 143 of the detector 14. The material of the first portion 221 of the light shielding structure 22 may be an opaque material or light-absorbing material which can block the light beam 30 from the emitter 12. For example, the first portion 221 of the light shielding structure 22 may not allow the light beam 30 to pass through. In some embodiments, the material of the first portion 221 of the light shielding structure 22 may be metal (e.g., copper) or an organic material. The first portion 221 of the light shielding structure 22 may fill the second opening 182 of the dielectric layer 18.

In some embodiments in which the material of the first portion 221 of the light shielding structure 22 is metal, the first openings 181 and the second opening 182 may be formed concurrently, and the first portion 221 of the light shielding structure 22 and the first conductive vias 191 may be formed concurrently. Furthermore, the RDL 20 may not contact the first portion 221 of the light shielding structure 22. However, in some embodiments in which the material of the first portion 221 of the light shielding structure 22 is an organic material, the RDL 20 may contact or cover the first portion 221 of the light shielding structure 22.

Figure 20:
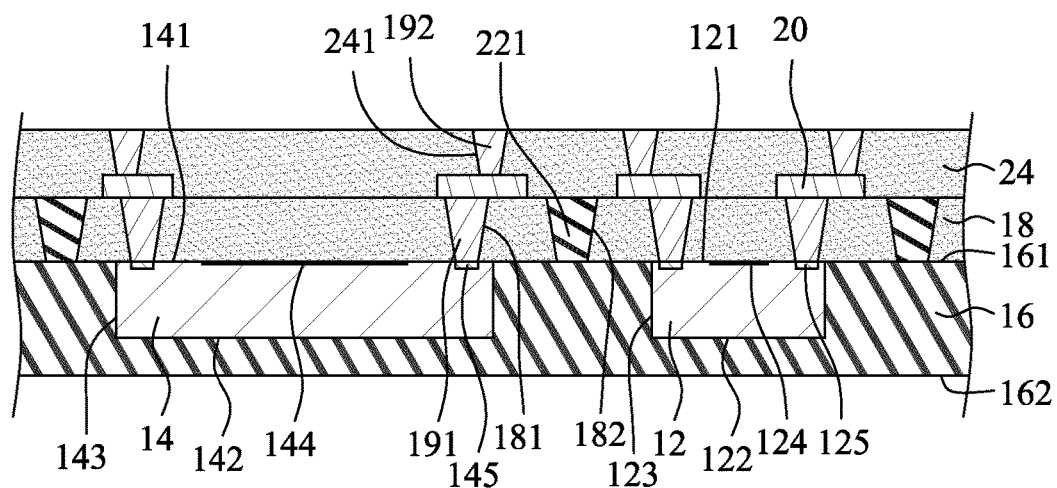

Referring to FIG. 20, the covering layer 24 is formed on the dielectric layer 18 to cover the dielectric layer 18 and the RDL 20. The covering layer 24 may be made from a transparent material such as PBO or PI which may be the same as or different from the material of the dielectric layer 18. For example, the covering layer 24 may allow the light beams 30, 31 to pass through. Then, the plurality of first openings 241 are formed on the covering layer 24. The first openings 241 may extend through the covering layer 24 to expose a portion of the RDL 20. Then, the plurality of second conductive vias 192 are formed in the first openings 241 of the covering layer 24 to electrically connect the RDL 20. The material of the second conductive vias 192 may be metal, such as, copper.

Figure 21:
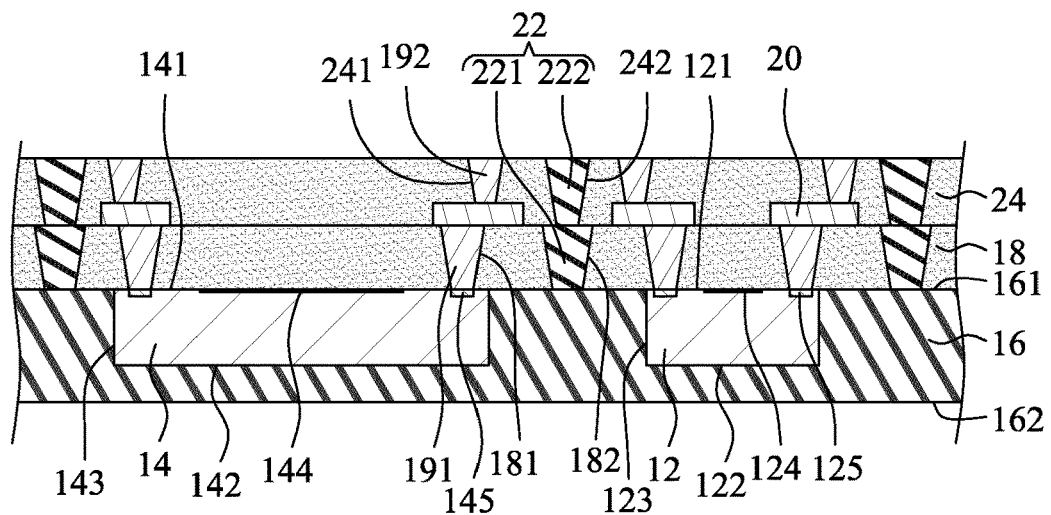

Referring to FIG. 21, at least one second opening 242 is formed on the covering layer 24. The second opening 242 may extend through the covering layer 24, and the location of the second opening 242 corresponds to or aligns with the location of the second opening 182 of the dielectric layer 18. In some embodiments, the second opening 242 of the covering layer 24 and the second opening 182 of the dielectric layer 18 may be formed concurrently at this stage. Then, the second portion 222 of the light shielding structure 22 is formed in the second opening 242 of the covering layer 24. The second portion 222 may be a wall corresponding to or aligning with the first portion 221 of the light shielding structure 22. The material of the second portion 222 of the light shielding structure 22 may be an opaque material or light-absorbing material which can block the light beam 30 from the emitter 12. In some embodiments, the material of the second portion 222 of the light shielding structure 22 may be metal (e.g., copper) or an organic material which may be the same as or different from the material of the first portion 221. The second portion 222 of the light shielding structure 22 may fill the second opening 242 of the covering layer 24. In some embodiments, the first portion 221 and the second portion 222 may be formed concurrently and integrally.

Then, the plurality of first external connectors 26, such as solder balls or solder bumps, are formed on the respective ones of the second conductive vias 192. Then, a singulation process may be performed to obtain a plurality of optical devices 1 as shown in FIG. 1.

Figure 22:
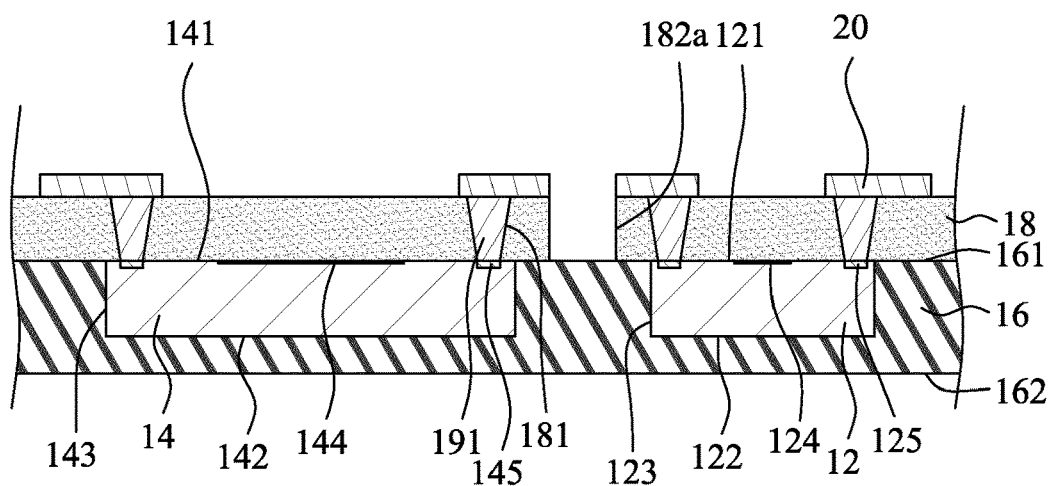
FIG. 22 and FIG. 23 depict a manufacturing process for manufacturing an optical device according to some embodiments of the present disclosure.
Figure 23:
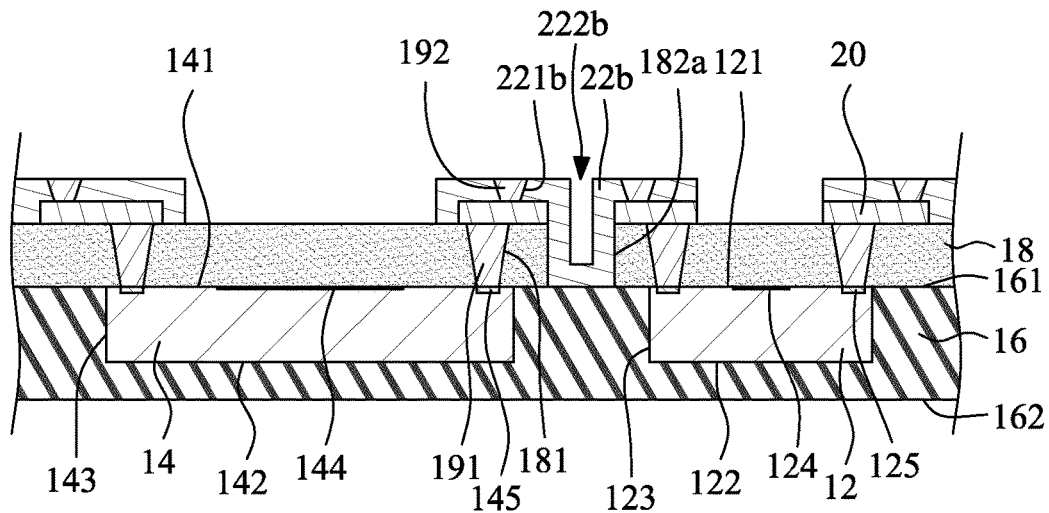

FIGS. 22-23 depict a manufacturing process for manufacturing an optical device according to some embodiments of the present disclosure. The initial stages of the illustrated process are the same as the stages illustrated in FIGS. 13 to 18. FIG. 22 depicts a stage subsequent to that depicted in FIG. 18. Referring to FIG. 22, at least one second opening 182a is formed on the dielectric layer 18. The second opening 182a may extend through the dielectric layer 18, and the location of the second opening 182a may correspond to or align with a location between the emitter 12 and the detector 14. The width of the second opening 182a of the dielectric layer 18 may be greater than the width of the second opening 182 of the dielectric layer 18 shown in FIG. 19.

Referring to FIG. 23, the light shielding structure 22b is formed in the second opening 182a of the dielectric layer 18 and is further disposed on the dielectric layer 18 to cover the dielectric layer 18 and the RDL 20. The light shielding structure 22b is not disposed directly above the light-emitting area 124 of the emitter 12 and the sensing area 144 of the detector 14. In one or more embodiments, the light shielding structure 22b in the second opening 182a of the dielectric layer 18 defines a central opening 222b. For example, the light shielding structure 22b may not completely fill the second opening 182a of the dielectric layer 18.

Then, the light shielding structure 22b on the dielectric layer 18 defines the plurality of first openings 221b to expose a portion of the RDL 20. The second conductive vias 192 are disposed in the first openings 221b of the light shielding structure 22b to electrically connect the RDL 20. Then, the plurality of first external connectors 26, such as solder balls or solder bumps, are formed on the respective ones of the second conductive vias 192. Then, a singulation process may be performed to obtain a plurality of optical devices 1b as shown in FIG. 4.

Figure 24:
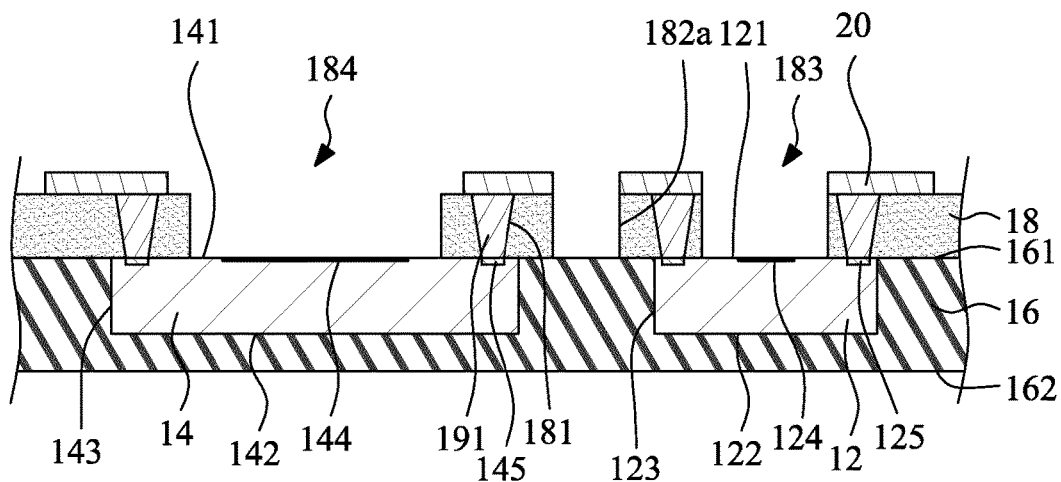
FIG. 24 depicts a manufacturing process for manufacturing an optical device according to some embodiments of the present disclosure.

FIG. 24 depicts a manufacturing process for manufacturing an optical device according to some embodiments of the present disclosure. The initial stages of the illustrated process are the same as the stages illustrated in FIGS. 13 to 18. FIG. 24 depicts a stage subsequent to that depicted in FIG. 18. Referring to FIG. 24, at least one second opening 182a, the first through hole 183 and the second through hole 184 is formed on the dielectric layer 18. The second opening 182a shown in FIG. 24 may be the same as the second opening 182a shown in FIG. 22. The first through hole 183 exposes the light-emitting area 124 of the emitter 12, and the second through hole 184 exposes the sensing area 144 of the detector 14. Then, the following stage of the illustrated process may be the same as the stage illustrated in FIG. 23, so as to obtain a plurality of optical devices 1c as shown in FIG. 5. In some embodiments, when a portion of the light shielding structure 22b is further disposed on the sidewall 1831 of the first through hole 183 and the sidewall 1841 of the second through hole 184, a plurality of optical devices 1d as shown in FIG. 6 may be obtained.

Figure 25:
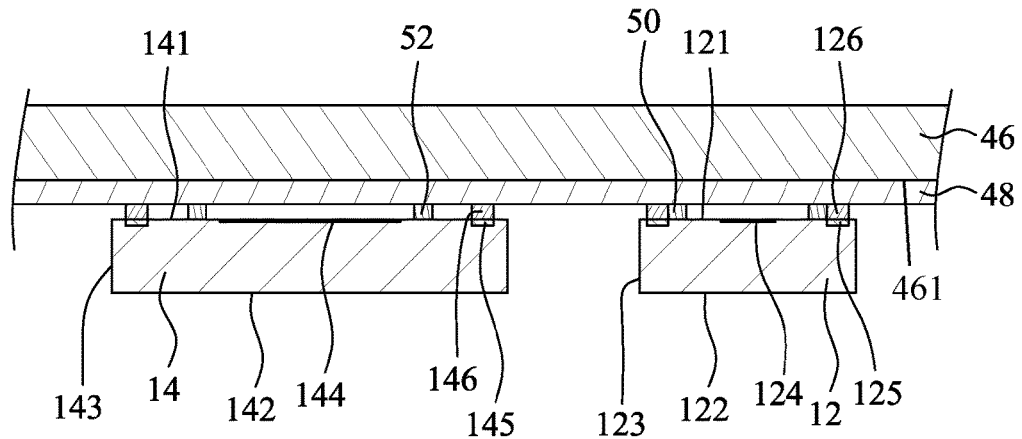
FIG. 25, FIG. 26 and FIG. 27 depict a manufacturing process for manufacturing an optical device according to some embodiments of the present disclosure.
Figure 26:
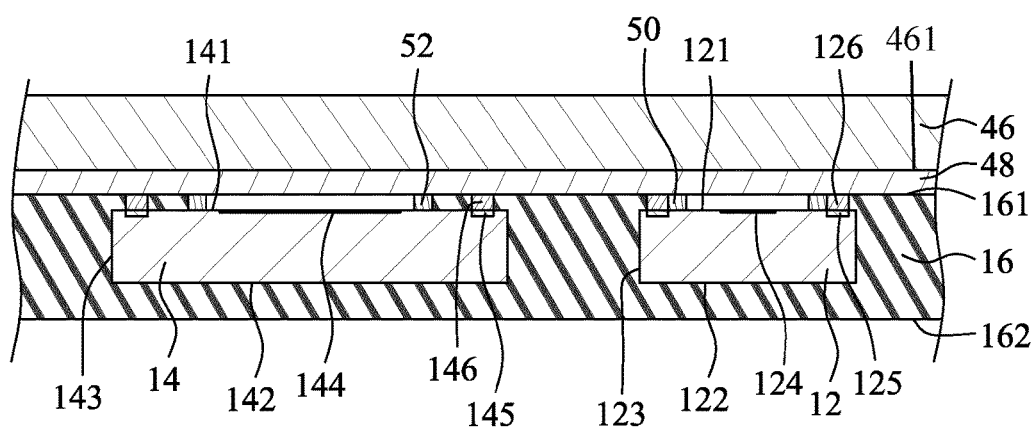
Figure 27:
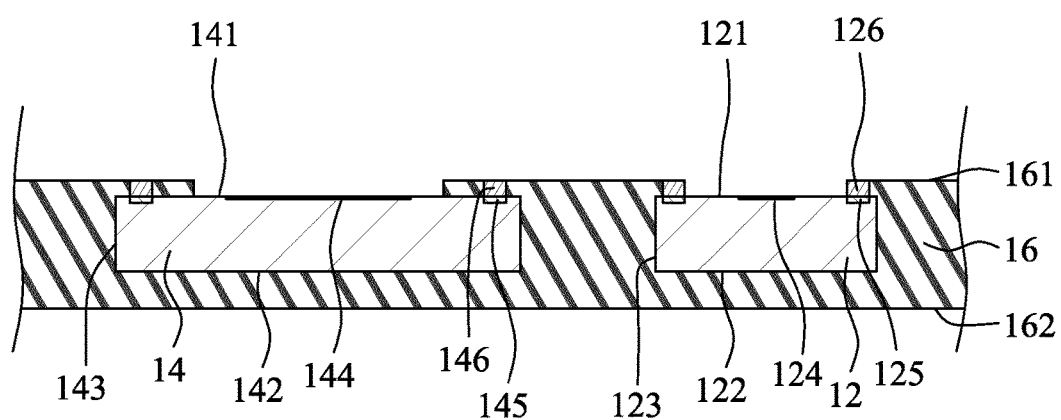

FIGS. 25-27 depict a manufacturing process for manufacturing an optical device according to some embodiments of the present disclosure. Referring to FIG. 25, the carrier 46 and the adhesion layer 48 are provided. The adhesion layer 48 is adhered to the first surface 461 of the carrier 46. Then, at least one emitter 12, at least one first dam 50, at least one detector 14 and at least one second dam 52 are attached to the first surface 461 of the carrier 46 through the adhesion layer 48. The emitter 12 and the detector 14 shown in FIG. 25 are similar to the emitter 12 and the detector 14 shown in FIG. 14, respectively, except that the emitter 12 further includes the plurality of conductive bumps 126 protruding from the first surface 121 of the emitter 12 and electrically connecting the pads 125 of the emitter 12, and the detector 14 further includes the plurality of conductive bumps 146 protruding from the first surface 141 of the detector 14 and electrically connecting the pads 145 of the detector 14. Each of the first dam 50 and the second dam 52 may be a ring shape including a flexible material. A height of the first dam 50 may be substantially equal to a height of the conductive bump 126, and a height of the second dam 52 may be substantially equal to a height of the conductive bump 146. The first dam 50 is interposed between the adhesion layer 48 and the first surface 121 of the emitter 12, and a size of an enclosed area by the first dam 50 may be greater than a size of the light-emitting area 124 of the emitter 12. For example, the first dam 50 may not contact the light-emitting area 124 of the emitter 12. In addition, the second dam 52 is interposed between the adhesion layer 48 and the first surface 141 of the detector 14, and a size of an enclosed area by the second dam 52 may be greater than a size of the sensing area 144 of the detector 14. For example, the second dam 52 may not contact the sensing area 144 of the detector 14.

Referring to FIG. 26, the encapsulation layer 16 (e.g., a molding compound) is formed to cover the second surface 122, the side surface 123 and a portion of the first surface 121 of the emitter 12 and the second surface 142, the side surface 143 and a portion of the first surface 141 of the detector 14. In addition, the encapsulation layer 16 further covers a portion of the adhesion layer 48 on the first surface 461 of the carrier 46. The encapsulation layer 16 include the first surface 161 and the second surface 162 opposite to the first surface 161.

Referring to FIG. 27, the carrier 46, the adhesion layer 48, the first dam 50 and the second dam 52 are removed from the encapsulation layer 16. Thus, the emitter 12 and the detector 14 are embedded in the encapsulation layer 16, and a portion of the first surface 121 of the emitter 12 and a portion of the first surface 141 of the detector 14 are exposed from the first surface 161 of the encapsulation layer 16. The first surface 161 of the encapsulation layer 16 is not coplanar with the first surface 121 of the emitter 12 and the first surface 141 of the detector 14.

Then, the following stages of the illustrated process may be the same as the stages illustrated in FIGS. 17-21, so as to obtain a plurality of optical devices if as shown in FIG. 8.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers (μm) of lying along a same plane, such as within 40 μm, within 30 μm, within 20 μm, within 10 μm, or within 1 μm of lying along the same plane.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

In the description of some embodiments, a component provided "on" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optical device, comprising:
an emitter;
a detector disposed adjacent to the emitter;
an encapsulation layer encapsulating the emitter and the detector;
a dielectric layer disposed on the emitter, the detector and the encapsulation layer;
a redistribution layer disposed on the dielectric layer and electrically connected to the emitter and the detector; and
a light shielding structure disposed on the encapsulation layer and corresponding to a location between the emitter and the detector.

2. The optical device of claim 1, wherein the dielectric layer is a transparent dielectric layer.

3. The optical device of claim 1, wherein the dielectric layer defines at least one opening corresponding to the location between the emitter and the detector.

4. The optical device of claim 3, wherein the light shielding structure is disposed in the opening of the dielectric layer.

5. The optical device of claim 3, wherein the opening of the dielectric layer extends through the dielectric layer.

6. The optical device of claim 1, wherein the dielectric layer defines at least two through holes, and each of the through holes exposes a respective one of the emitter and the detector.

7. The optical device of claim 6, wherein the light shielding structure is disposed on a sidewall of each of the through holes of the dielectric layer.

8. The optical device of claim 1, wherein:
the dielectric layer defines a plurality of openings;
the light shielding structure includes a plurality of wall segments in respective ones of the openings;
the wall segments are arranged in a fence structure; and
a portion of the redistribution layer is routed between the wall segments.

9. The optical device of claim 1, wherein:
the emitter includes a plurality of conductive bumps protruding from a first surface of the emitter;
the detector includes a plurality of conductive bumps protruding from a first surface of the detector; and
the encapsulation layer covers a portion of the first surface of the emitter and a portion of the first surface of the detector.

10. The optical device of claim 1, further comprising a plurality of conductive vias extending through the encapsulation layer.

11. The optical device of claim 10, further comprising a conductive structure disposed on the encapsulation layer and electrically connected to the conductive vias.

12. The optical device of claim 11, further comprising a semiconductor chip disposed on and electrically connected to the conductive structure.

13. The optical device of claim 12, wherein a portion of a first surface of the emitter or a portion of a first surface of the detector is covered by the encapsulation layer.

14. The optical device of claim 13, wherein a second surface of the emitter opposite to the first surface of the emitter or a second surface of the detector opposite to the first surface of the detector is covered by the encapsulation layer.

15. The optical device of claim 1, wherein a first surface of the emitter or a first surface of the detector is substantially coplanar with a first surface of the encapsulation layer.

16. The optical device of claim 15, wherein a second surface of the emitter opposite to the first surface of the emitter or a second surface of the detector opposite to the first surface of the detector is covered by the encapsulation layer.

17. The optical device of claim 1, further comprising a plurality of external connectors disposed on and electrically connected to the redistribution layer.

18. An optical device, comprising:
a light source;
a light receiver disposed adjacent to the light source;
an encapsulation layer encapsulating the light source and the light receiver;
a redistribution layer extending from and electrically connected to the light source and the light receiver; and
a light shielding structure disposed on the encapsulation layer and corresponding to a location between the light source and the light receiver.

19. The optical device of claim 18, further comprising a transparent dielectric layer disposed on the light source, the light receiver and the encapsulation layer.

20. The optical device of claim 19, wherein the transparent dielectric layer defines at least one opening corresponding to the location between the light source and the light receiver, and the light shielding structure is disposed in the opening of the transparent dielectric layer.

21. The optical device of claim 20, wherein the light shielding structure disposed in the opening of the transparent dielectric layer defines a central opening.

\* \* \* \* \*